US009291919B2

(12) United States Patent
Oizumi

(10) Patent No.: US 9,291,919 B2
(45) Date of Patent: Mar. 22, 2016

(54) LIGHT EXPOSURE METHOD, AND LIGHT EXPOSURE APPARATUS

(75) Inventor: Hiroaki Oizumi, Tachikawa (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 918 days.

(21) Appl. No.: 13/290,204

(22) Filed: Nov. 7, 2011

(65) Prior Publication Data

US 2012/0127446 A1 May 24, 2012

(30) Foreign Application Priority Data

Nov. 22, 2010 (JP) ................................. 2010-259894

(51) Int. Cl.
*G03F 7/20* (2006.01)
(52) U.S. Cl.
CPC .................................. *G03F 7/70916* (2013.01)
(58) Field of Classification Search
CPC ............ G03F 7/70916; G03F 7/70925; G03F 7/70933; G03F 7/702; G03F 7/70208
USPC ............. 355/53, 55, 67, 77; 29/53, 55, 67, 77
See application file for complete search history.

(56) References Cited

U.S. PATENT DOCUMENTS

| | | | |
|---|---|---|---|
| 6,198,792 B1 * | 3/2001 | Kanouff et al. ................. | 378/34 |
| 7,330,236 B2 | 2/2008 | Hasegawa | |
| 7,423,724 B2 | 9/2008 | Hasegawa et al. | |
| 7,750,319 B2 | 7/2010 | Lorusso et al. | |
| 2002/0096647 A1 * | 7/2002 | Moors et al. ................ | 250/492.1 |
| 2006/0215143 A1 * | 9/2006 | Yamaguchi et al. ............ | 355/69 |
| 2008/0304031 A1 * | 12/2008 | Kanehira et al. ................ | 355/53 |
| 2010/0192973 A1 * | 8/2010 | Ueno et al. ..................... | 134/1.1 |

FOREIGN PATENT DOCUMENTS

| | | |
|---|---|---|
| JP | 2004-356410 A | 12/2004 |
| JP | 2005-101537 A | 4/2005 |
| JP | 2005-244016 A | 9/2005 |
| JP | 2006-269942 A | 10/2006 |
| JP | 2008-078642 A | 4/2008 |
| JP | 2010-186995 A | 8/2010 |

OTHER PUBLICATIONS

Machine translation of JP 2005-244016 A published Sep. 8, 2005.*
Japanese Office Action received in Japanese Application No. 2010-259894 dated Apr. 8, 2014.

* cited by examiner

*Primary Examiner* — Steven H Whitesell Gordon
(74) *Attorney, Agent, or Firm* — Mattingly & Malur, PC

(57) ABSTRACT

There is provided an EUV exposure apparatus which restrains its optical systems or a mask used therein from being polluted by contaminations generated in its chamber. An energy beam generating source is arranged near a wafer stage set in the chamber of the EUV exposure apparatus to decompose an emission gas generated from a resist painted on the front surface of a wafer by an energy beam. In this manner, lightening mirrors configuring a lightening optical system as one of the optical systems, projection mirrors configuring a projection optical system as another of the optical systems, the mask, and others are protected from being polluted by contaminations.

15 Claims, 14 Drawing Sheets

LIGHT EXPOSURE METHOD, AND LIGHT EXPOSURE APPARATUS

CROSS-REFERENCE TO RELATED APPLICATIONS

The disclosure of Japanese Patent Application No. 2010-259894 filed on Nov. 22, 2010 including the specification, drawings and abstract is incorporated herein by reference in its entirety.

BACKGROUND

The present invention relates to a light exposure technique used to transfer a pattern into an LSI and the like, in particular, a technique which is effectively applied to a light exposure method and a light exposure apparatus in which extreme ultraviolet (hereinafter referred to as EUV) rays are used as exposure light.

An LSI is produced by a lithographic technique of radiating exposure light onto a mask that is an original plate in which a circuit pattern is drawn, which may be referred to as a reticle, thereby transferring the circuit pattern onto a surface of a semiconductor wafer (hereinafter referred to as a wafer) by aid of a demagnification optical system.

As LSIs have been made higher in integration degree and action-speed in recent years, a tendency that their circuit patterns are made minuter has been rapidly enhanced. The method used for making the circuit patterns minuter is generally a method of making the wavelengths of exposure light shorter. Specifically, the method for making the circuit patterns minuter has been transitioning from lithographic techniques using, as exposure light, ultraviolet rays, such as the g-ray (wavelength: 436 nm) or the i-ray (wavelength: 365 nm), to lithographic techniques using, as exposure light, the KrF excimer laser (wavelength: 248 nm) or the ArF excimer laser (wavelength: 193 nm). Recently, in order to make the pattern even minuter, immersion ArF lithography, in which the refractive index of water is used, or a double patterning technique of performing light exposure two times is also being applied to mass production of LSIs.

Furthermore, researches have been made recently about a lithographic technique using, as exposure light, an EUV ray (wavelength: 13.5 nm) as a technique using a high-energy beam having a shorter wavelength. When the EUV ray is used as exposure light, the size of circuit patterns that can be resolved becomes 1/10 or less of the wavelength of ArF. Thus, attention has been paid to this technique as a method for forming extremely minute patterns.

When the EUV ray is used, a mask therefor is of a reflection type. A lightening optical system and a projection optical system therefor are also composed of reflection-type members, that is, mirrors. An EUV exposure apparatus is composed of a light source for emitting an exposure light-bundle, a lightening optical system for lightening a mask, which is an original plate, with the exposure light-bundle, a projection optical system for projecting the pattern of the mask to an exposure-receiving object (i.e., an object which is to be exposed to the light-bundle), a stage on which the mask is to be put, a stage on which the exposure-receiving object is to be put, a space for holding the projection optical system, and others. The exposure-receiving object is a wafer having a surface onto which a photosensitive material called a resist is painted.

In general, EUV rays are absorbed into all materials, so that the air cannot transmit the EUV rays. About light exposure apparatuses using EUV rays, therefore, in order to cause exposure light to reach onto a surface of a wafer while the light has a sufficient illuminance, it is necessary to decrease or exclude any light-absorbing material in a path for the exposure light, thereby keeping the optical path space (concerned) into a high vacuum state. It is also necessary that the optical path space is filled with a material from which an emission gas is discharged as slightly as possible.

In the above-mentioned exposure apparatus, in which an EUV ray is used as exposure light, the following remain in its optical path space: any emission gas generated from the resist (concerned) by irradiation with the EUV ray, and any gas generated from substances present in the exposure apparatus. Herein, the emission gas denotes a gas that is generated by the decomposition of the composition of the resist when the resist is exposed to the EUV ray, and is made mainly of a carbon compound. When this emission gas is excited by the EUV ray, molecules of the carbon compound are bonded to each other to turn into deposits called the so-called contaminations. The deposits adhere onto one or more surfaces of the mask or the optical systems (mirrors).

When the contaminations adhere onto the surface(s) of the mask or the mirrors, the reflectivity of the mirror(s) lowers so that the light quantity of the EUV ray reaching to the wafer surface (concerned) is reduced. As a result, a light exposure period is increased which is necessary for transferring the circuit pattern of the mask to the resist. Moreover, the illuminance of the EUV ray becomes largely uneven, and the wave front aberration is also increased. For these and other reasons, optical performances of the EUV exposure apparatus are remarkably deteriorated so that the precision of the transfer of the circuit pattern is also declined.

Thus, as disclosed in Patent Documents 1 to 3 listed up below and others, suggested are various techniques for removing contaminations generated in an EUV apparatus.

Patent Document 1 (Japanese Unexamined Patent Publication No. 2004-356410) discloses a technique of setting electrodes for collecting contaminations or a device for ionizing contaminations around an opening for EUV ray transmission, thereby restraining the contaminations from adhering onto surfaces of mirrors and others.

Patent Document 2 (Japanese Unexamined Patent Publication No. 2006-269942) discloses a technique of setting up an inert-gas-supplying device in an optical path space in an EUV exposure apparatus and further making a gas-discharging space between the optical path space and a wafer stage space, thereby discharging contaminations generated from the resist (concerned), together with inert gas therefrom.

Patent Document 3 (Japanese Unexamined Patent Publication No. 2005-101537) discloses a technique of setting a cold trap, such as a cryopanel, in an optical path space in an EUV exposure apparatus, thereby adsorbing contaminations.

RELATED ART DOCUMENT LIST

Patent Documents

Patent Document 1: (Japanese Unexamined Patent Publication No. 2004-356410

Patent Document 2: Japanese Unexamined Patent Publication No. 2006-269942

Patent Document 3: Japanese Unexamined Patent Publication No. 2005-101537

SUMMARY

The inventors have analyzed emission gases generated from a resist in order to remove contaminations generated in an EUV exposure apparatus. As a result, the inventors have gained a finding that the pollution of the mask or the mirrors by the contaminations is caused mainly by carbon compounds each having a molecular weight of about 100 to 300 out of the emission gases. The inventors have then found out that when the partial pressures of the carbon compounds in an optical path space in the EUV exposure apparatus can be decreased, the pollution of the mask or the mirrors by the contaminations can be remarkably restrained. Thus, the present invention has been made.

An object of the invention is to provide a light exposure technique making it possible to protect one or more mirrors that configure a lightening system or projection system of an EUV exposure apparatus, or a mask used therein from being polluted by contaminations, thereby improving the production yield of devices produced by use of the apparatus, the reliability thereof, and other productivities thereof.

The object of the invention, other objects thereof, and novel features thereof will be made apparent by the description of the specification, and drawings attached thereto.

A typical aspect of the invention disclosed in the specification of the present application is briefly as follows:

The aspect is a light exposure apparatus including a chamber which holds an exposure light source that emits an EUV ray, a mask stage on which a mask in which a predetermined pattern is formed is to be put, a lightening optical system that lightens the mask with the EUV, an exposure-receiving object stage on which an exposure-receiving object having a surface on which a resist is painted is to be put, and a projection optical system that projects the pattern formed in the mask to the exposure-receiving object. In the apparatus, the following are set up inside the chamber: an energy beam generating source that generates an energy beam for decomposing an emission gas from the resist; and a gas discharging system that discharges any gas inside the chamber.

Advantageous effects of the typical aspect, out of aspects of the invention disclosed in the specification of the present application, are briefly as follows:

The emission gas from the resist is decomposed by the energy beam, thereby making it possible to restrain the generation of contaminations resulting from the emission gas. Thus, mirrors that configure the lightening and projection optical systems of the EUV exposure apparatus can be protected from being polluted by contaminations.

DETAILED DESCRIPTION

Hereinafter, embodiments of the invention will be described in detail with reference to the drawings. In all the figures referred to in order to describe the embodiments, the same reference numbers or signs are attached to members having the same function, and a repeated description thereabout is omitted. In the embodiments, a repeated description about members identical with each other or similar to each other is not in principle made unless necessary. Even when any one of the figures referred to in order to describe the embodiments is a plan view, the view may be hatched, and even when any one of the figures is a sectional view, hatching into the view may be omitted in order to make the structure illustrated in the view easy to understand.

First Embodiment

Figure 1:
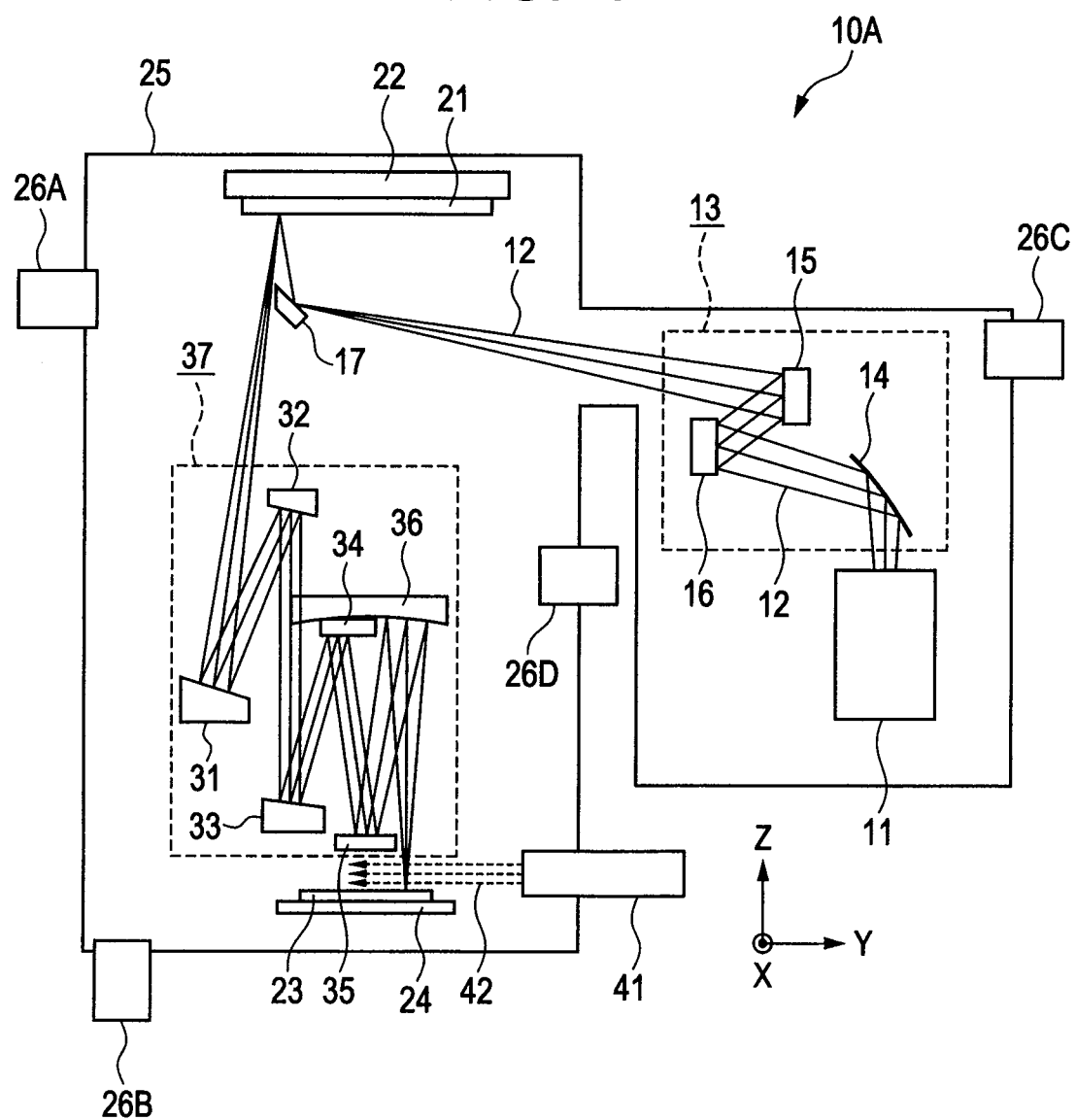
FIG. 1 is a schematic structural view of an EUV exposure apparatus of a first embodiment of the invention.

FIG. 1 is a schematic structural view illustrating a scanning EUV exposure apparatus of a first embodiment of the invention. This EUV exposure device, which is an apparatus 10A, is composed of an EUV ray source 11 for generating an EUV exposure light-bundle 12; a lightening optical system 13 composed of lightening mirrors 14, 15 and 16; a projection optical system 37 composed of projection mirrors 31, 32, 33, 34, 35 and 36; a turn mirror 17; a mask stage 22 on which a reflection-type mask 21 is to be fitted; a wafer stage 24 on which a wafer 23, which is an exposure-receiving object, is to be mounted; a chamber 25 for holding these members; plural pumps 26A, 26B, 26C and 26D for exhausting the chamber 25; and others.

A multi-layered film (not illustrated) for reflecting the EUV exposure light-bundle 12 regularly is formed on the front surface of each of the turn mirror 17, the mask 21 and the projection mirrors 31 to 36. A resist for EUV rays, which is not illustrated, is painted onto the front surface of the wafer 23. The mask stage 22 and the wafer stage 24 have a mechanism for scanning these stages in synchronization with each other at a ratio proportional to a used shrinkage ratio as the ratio between the speeds of the stages. Hereinafter, the in-plane scanning direction of the mask 21 or the wafer 23 is defined as the Y axis direction, the in-plane direction perpendicular thereto is defined as the X axis direction, and the direction perpendicular to the plane of the mask 21 or the wafer 23 is defined as the Z axis direction.

In a general scanning light exposure apparatus, a mask and a wafer are scanned in synchronization with each other to attain one shot of light exposure (called a scanning exposure). Specifically, while the exposure light-bundle generated from the light source is simultaneously scanned onto the mask and the exposure-receiving object (the wafer), the wafer is exposed to the light, so that one shot of light exposure is attained. Thereafter, when the exposure light-bundle is discontinued or the bundle does not reach to the front surface of the wafer with a shutter or some other, the one shot, which may be called one scan, is finished. Next, the wafer is shifted to the initial position of the next shot of light exposure, this operation being called a step or stepping. Thereafter, the mask and the wafer are again scanned, thereby attaining light exposure (a second scan). In the scanning light exposure apparatus, such a scan and a step are alternately repeated, thereby exposing substantially the whole of the front surface of the wafer to the light.

As illustrated in FIG. 1, the EUV exposure apparatus 10A of the embodiment has an energy beam generating source 41 that generates an energy beam 42 for emission-gas-decomposition. The energy beam 42 is, for example, a light beam including one or more visible infrared rays, ultraviolet rays, deep ultraviolet rays, extreme ultraviolet rays, vacuum ultraviolet rays, or soft X rays; a beam including charged particles such as electrons or ions; or a neutral molecule beam. The energy beam generating source 41 is, for example, a mercury lamp, a xenon lamp, an excimer lamp, an excimer laser source, a semiconductor laser source, a laser-excited plasma light source, a discharge-excited plasma light source, an electron beam source, an ion beam source, a proton beam source.

In order to improve the directivity of the energy beam 42, it is preferred to set up a light-condensing optical system, as the need arises, to the energy beam generating source 41 which emits a light beam including one or more light rays, such as one or more visible infrared rays, ultraviolet rays, deep ultraviolet rays, extreme ultraviolet rays, vacuum ultraviolet rays, or soft X rays. It is also preferred to set up an electromagnetic optical system to the energy beam generating source 41 which emits charged particles such as electrons or ions.

The energy beam 42 emitted from the energy beam generating source 41 decomposes emission gases that are generated from the resist painted on the front surface of the wafer 23 and are present inside the chamber 25. As molecules of the gases are larger in molecular weight, the molecules are more easily decomposed at this time. Thus, out of the emission gases, carbon compounds each having a molecular weight of about 100 to 300, which mainly cause contaminations, are remarkably decreased in partial pressure.

The energy beam generating source 41 may be set at any location inside the chamber 25. It is desired to arrange the source 41 near or around the wafer stage 24, on which the wafer 23 as a generation source of the emission gases is mounted. According to this manner, the emission gases generated from the resist can be rapidly decomposed.

The energy beam generating source 41 may be set at a single site 25 inside the chamber 25, or energy beam generating sources 41 may be set at plural sites, respectively, inside the chamber 25. At the time, it is allowable to set, as the sources 41, energy beam generating sources identical with each other in kind, or a combination of energy beam generating sources different from each other in kind.

Figure 2:
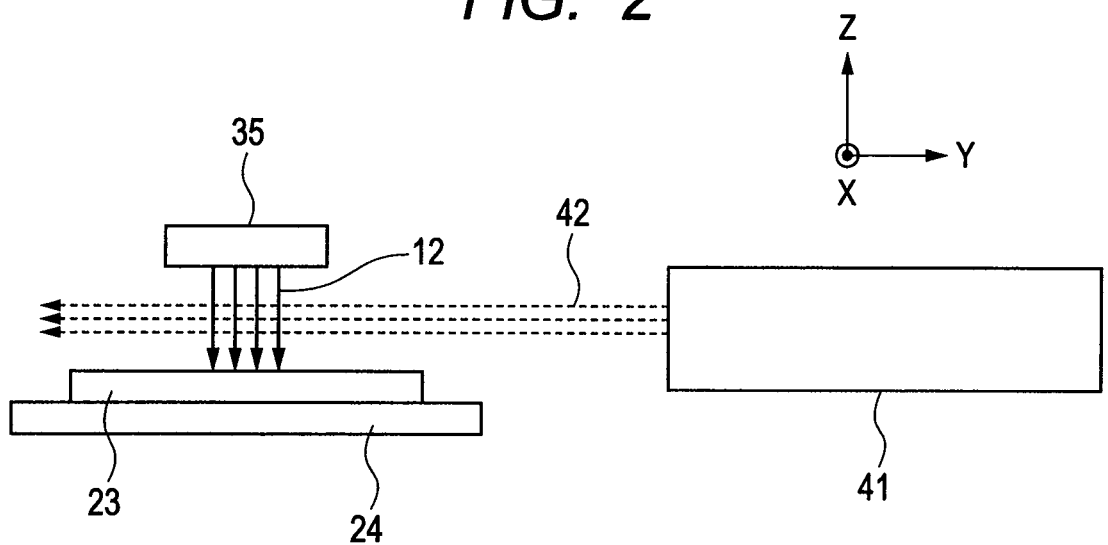
FIG. 2 is an enlarged view illustrating a partial region (i.e., a space for exposing an exposure-receiving object to EUV rays and the vicinity of the space) of the apparatus in FIG. 1.
Figure 3:
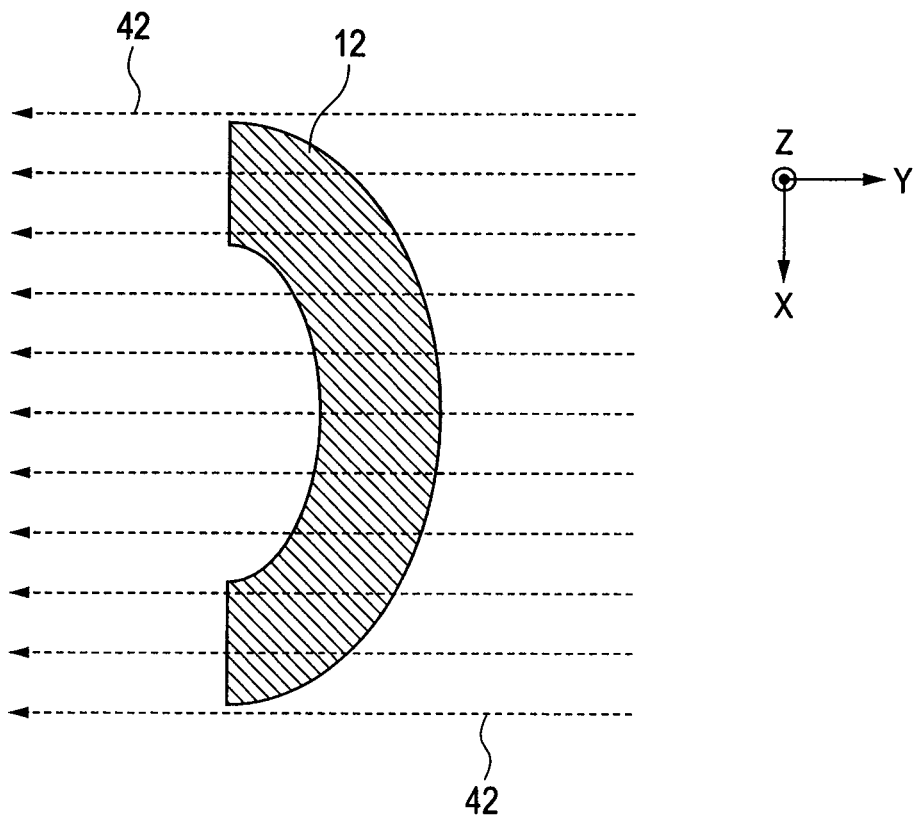
FIG. 3 is an enlarged plan view illustrating a partial region (i.e., the space for exposing the exposure-receiving object to the EUV rays) of the apparatus in FIG. 1.

FIG. 2 is an enlarged view illustrating a space for exposing the exposure-receiving object (wafer 23) to the EUV rays inside the EUV exposure apparatus 10A, and a situation near the space. FIG. 3 is an enlarged plan view illustrating the space, for exposing the exposure-receiving object to the EUV rays, inside the EUV exposure apparatus 10A.

Figure 4:
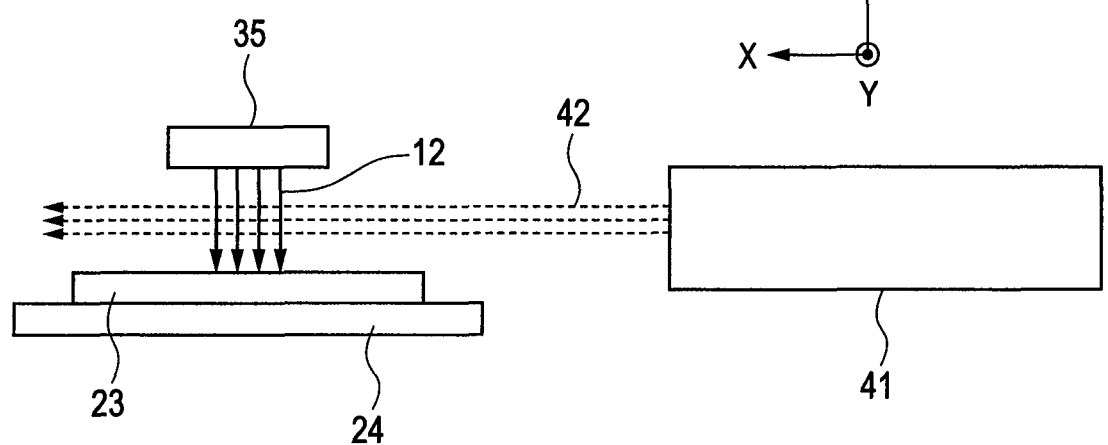
FIG. 4 is an enlarged view illustrating a different example of the EUV exposure apparatus that is the first embodiment of the invention.
Figure 5:
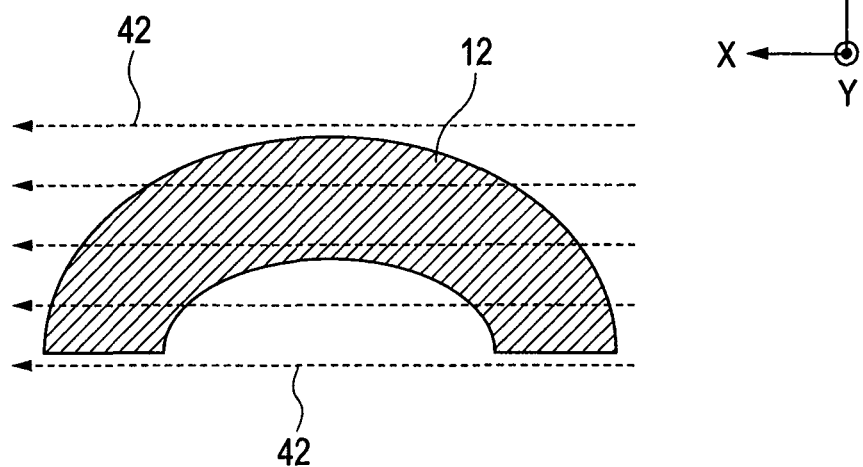
FIG. 5 is an enlarged plan view illustrating the different example of the EUV exposure apparatus that is the first embodiment of the invention.

The EUV exposure light-bundle 12 has, for example, a two-dimensional pattern in a circular arc form, and is radiated over the X-Y face directions along the Z axis direction. In the meantime, the energy beam 42 is radiated along the Y-axis direction. As illustrated in FIGS. 4 and 5, it is allowable to radiate the EUV exposure light-bundle 12 over the X-Y face directions along the Z axis direction, and radiate the energy beam 42 along the X axis.

It is desired that a unit for enlarging the area which extends over the X-Y face directions and is to be irradiated with the beam is set to the energy beam generating source 41 as the need arises. When the energy beam 42 is a light beam including one or more light rays such as one or more visible infrared rays, ultraviolet rays, deep ultraviolet rays, extreme ultraviolet rays, vacuum ultraviolet rays or soft X rays, the unit may be, for example, an optical system making the incident angle of the energy beam 42 variable. When the energy beam 42 is a beam including charged particles such as electrons or ions, the unit may be, for example, an electromagnetic optical system that allows an electrostatic deflection or electromagnetic deflection of the particles.

When the wafer 23, which is a single wafer, is exposed to the EUV rays in the EUV exposure apparatus 10A, the timing of radiating the energy beam 42 may be varied, considering the amounts of the emission gases, or the kinds thereof.

Figure 6:
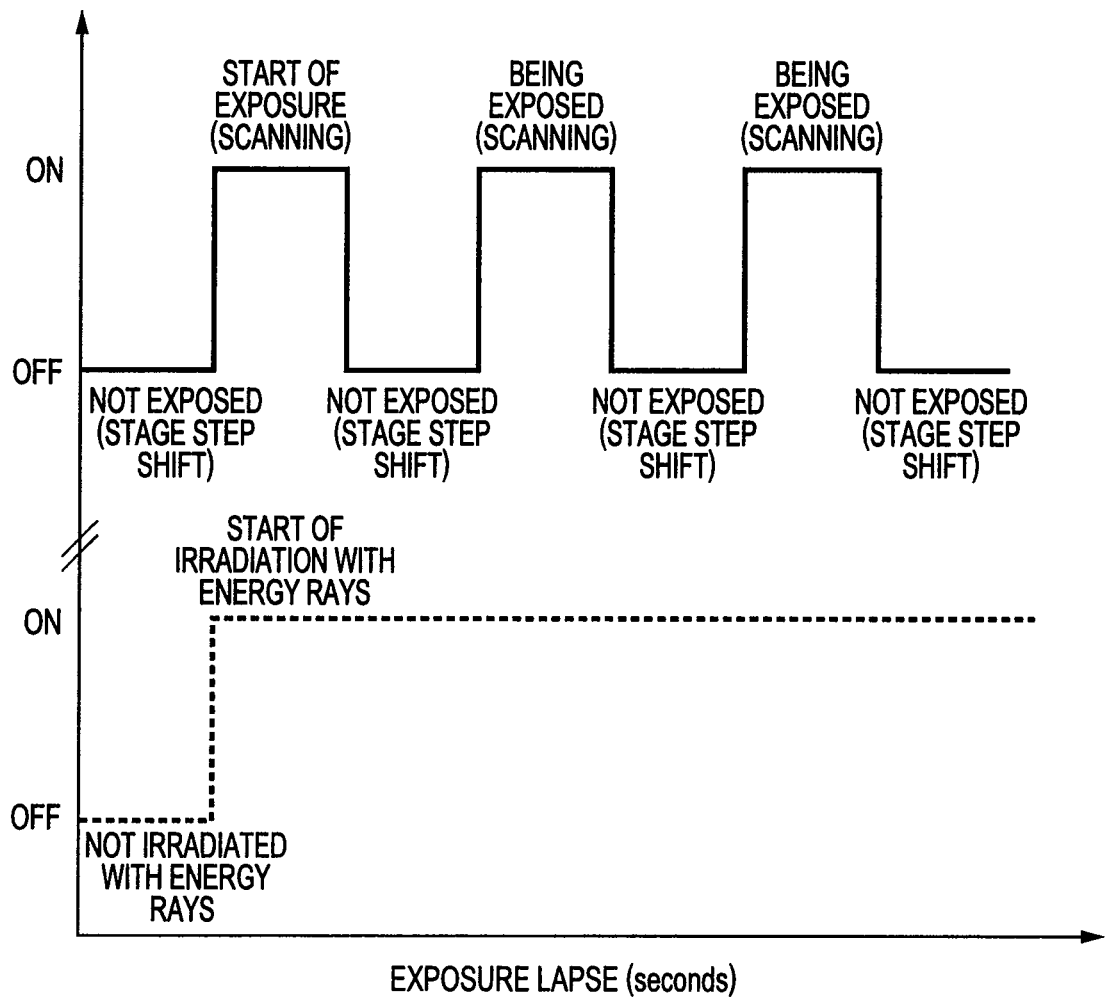
FIG. 6 is a timing chart showing an example of the timing at which an EUV exposure light-bundle emitted from an EUV ray source reaches to a wafer, and the timing of radiating an energy beam.

FIG. 6 is a timing chart showing an example of the timing at which the EUV exposure light-bundle 12 emitted from the EUV ray source 11 reaches to the wafer 23, and the timing of radiating the energy beam 42 (i.e., the timing of irradiating the wafer 23 with the beam 42). In this example, at the same time when the EUV exposure light-bundle 12 reaches to the wafer 23 to start a scanning exposure, the energy beam 42 is radiated. Thereafter, while a scanning exposure and a shift (step) of the wafer stage 24 are alternately repeated, the radiation of the energy beam 42 is continuously performed.

Figure 7:
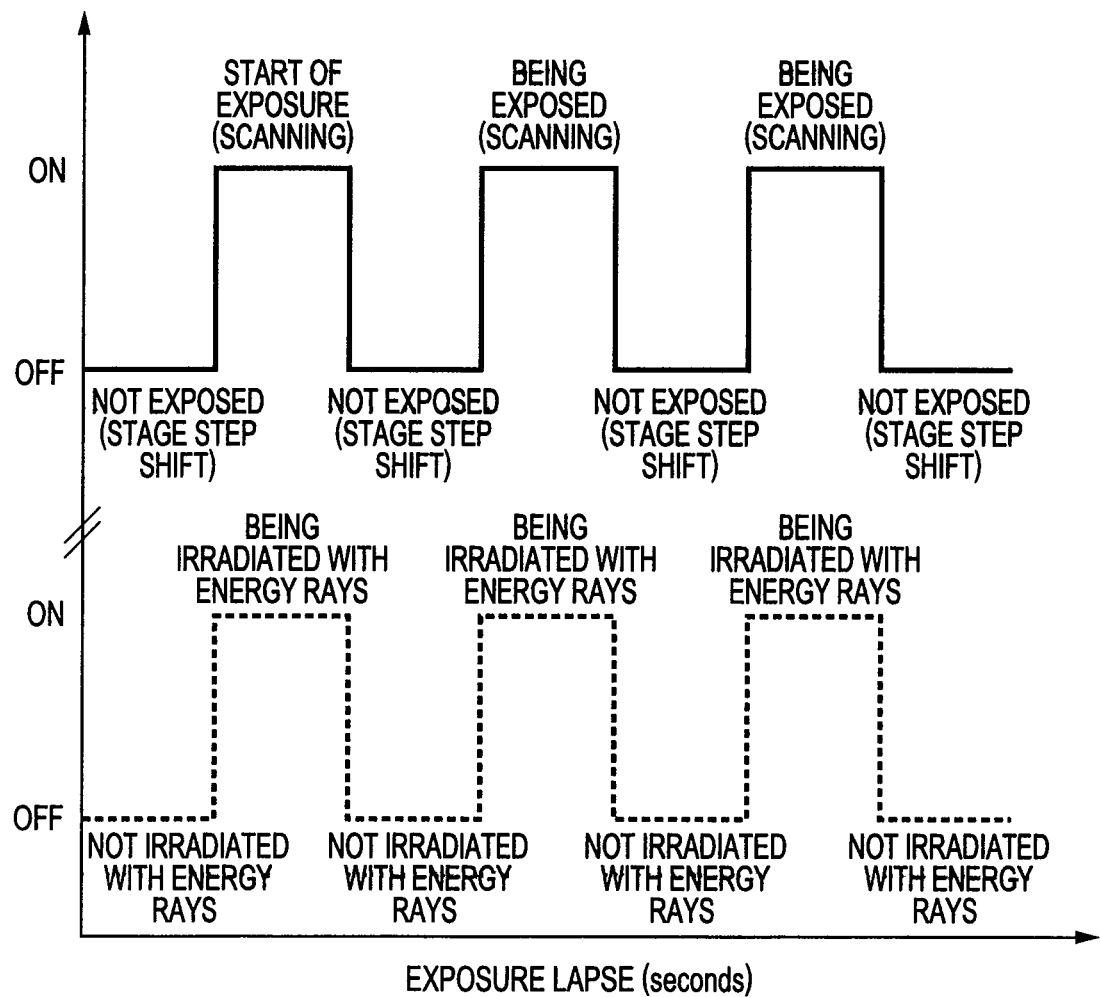
FIG. 7 is a timing chart showing another example of the timing at which the EUV exposure light-bundle emitted from the EUV ray source reaches to the wafer, and the timing of radiating the energy beam.

In a timing example shown in FIG. 7, at the same time when any scanning exposure is started, the energy beam 42 is radiated. When any shot of the exposure is finished, the radiation of the energy beam 42 is also stopped. Next, the wafer stage 24 is shifted (stepped), and subsequently the next scanning exposure is started so that the energy beam 42 is again radiated. Thereafter, in the same manner, only while a scanning exposure is performed, the energy beam 42 is radiated.

Figure 8:
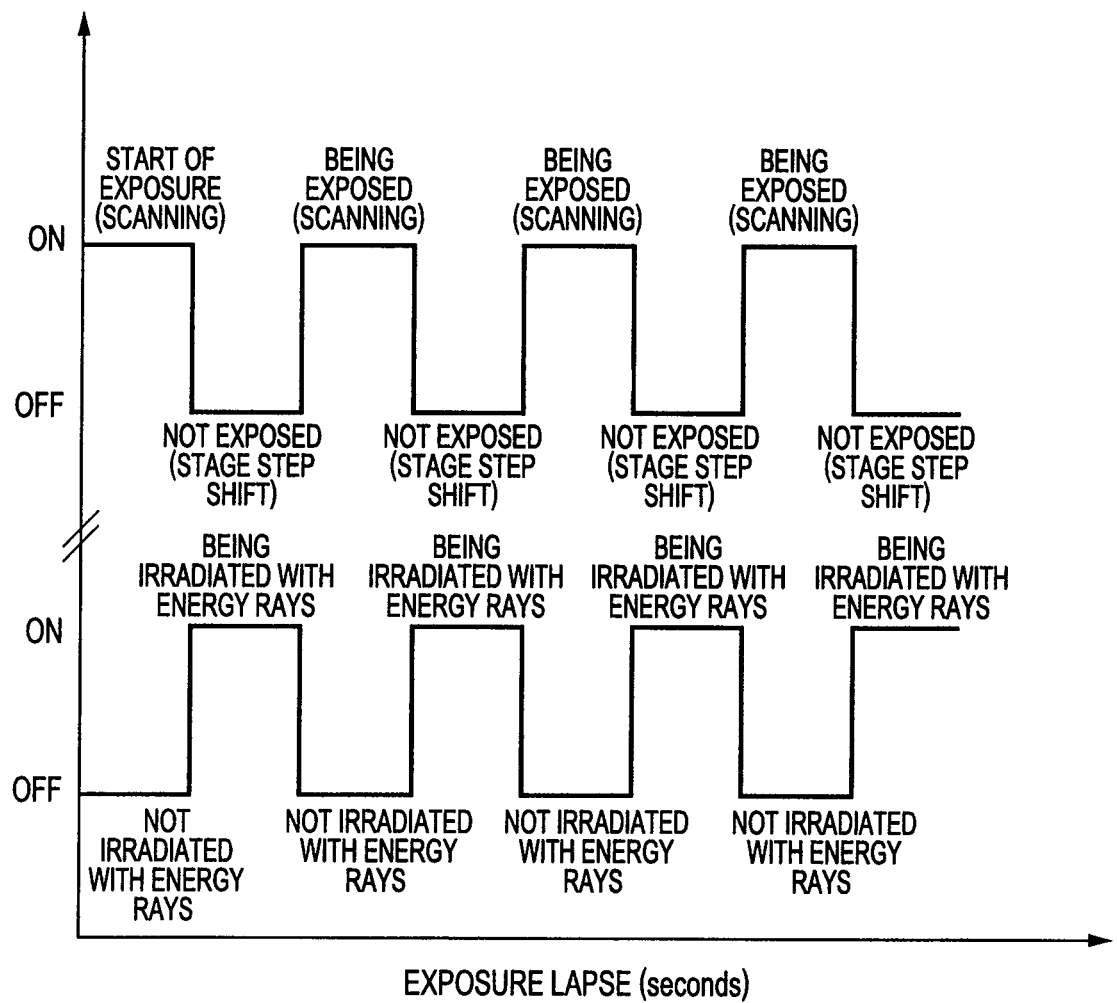
FIG. 8 is a timing chart showing still another example of the timing at which the EUV exposure light-bundle emitted from the EUV ray source reaches to the wafer, and the timing of radiating the energy beam.

In an example shown in FIG. 8, the timing of scanning exposures and the timing of the radiation of the energy beam 42 are reverse to those shown in FIG. 7. Specifically, while any scanning exposure is performed, the radiation of the energy beam 42 is stopped. Only while the wafer stage 24 is shifted (stepped), the energy beam 42 is radiated.

When the emission gases from the resist are decomposed by the energy beam 42 in this way, the generation of contaminations resulting from the emission gases can be restrained. This manner makes it possible to protect the members of the EUV exposure apparatus 10A and the mask 21 from being polluted by contaminations, the members being the lightening mirrors 14 to 16 configuring the lightening optical system 13, the projection mirrors 31 to 36 configuring the optical system 37, and others. Thus, the production yield of devices produced by use of the apparatus, the reliability thereof, and other productivities thereof can be improved.

Second Embodiment

Figure 9:
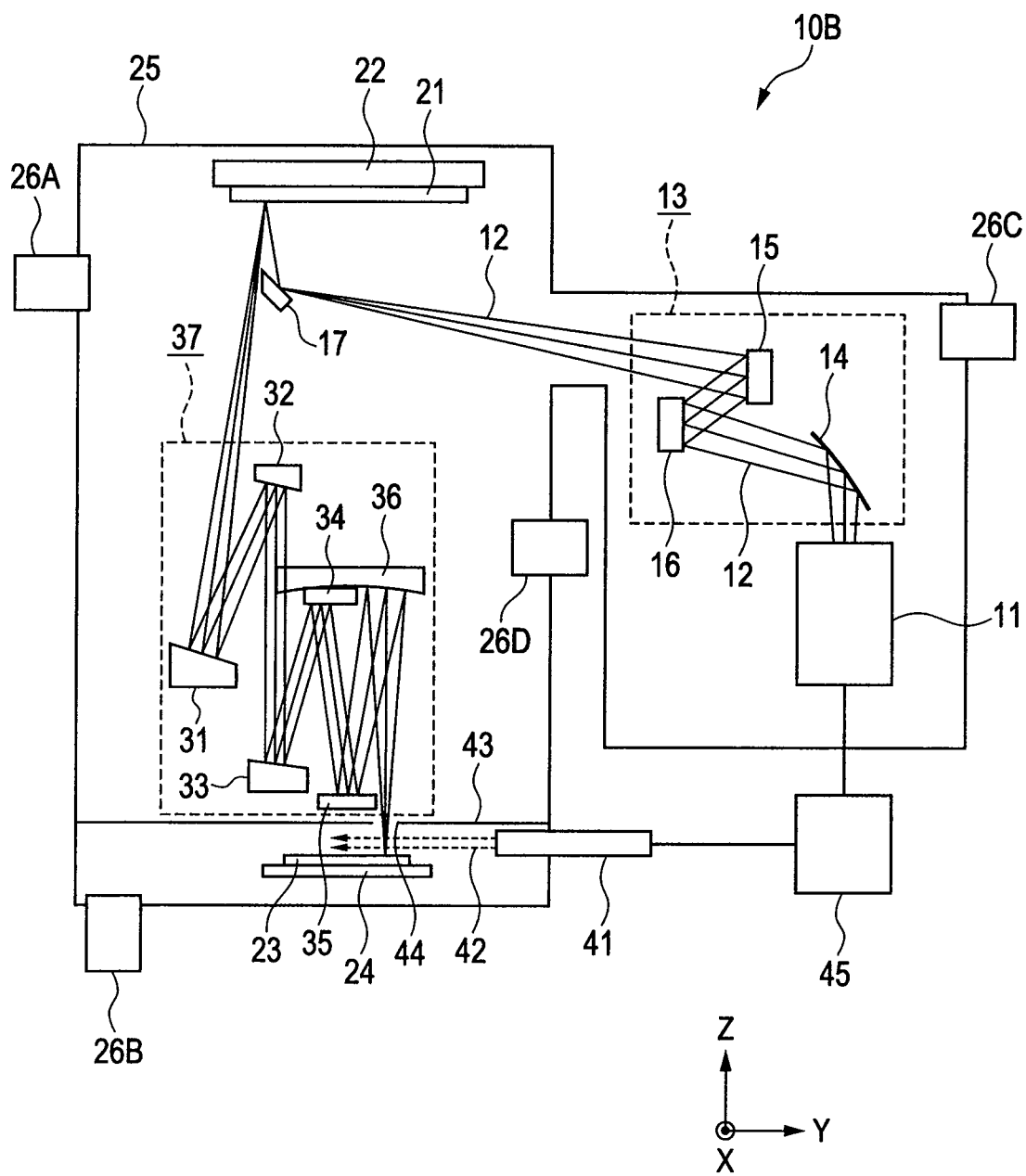
FIG. 9 is a schematic structural view of an EUV exposure apparatus that is a second embodiment of the invention.
Figure 10:
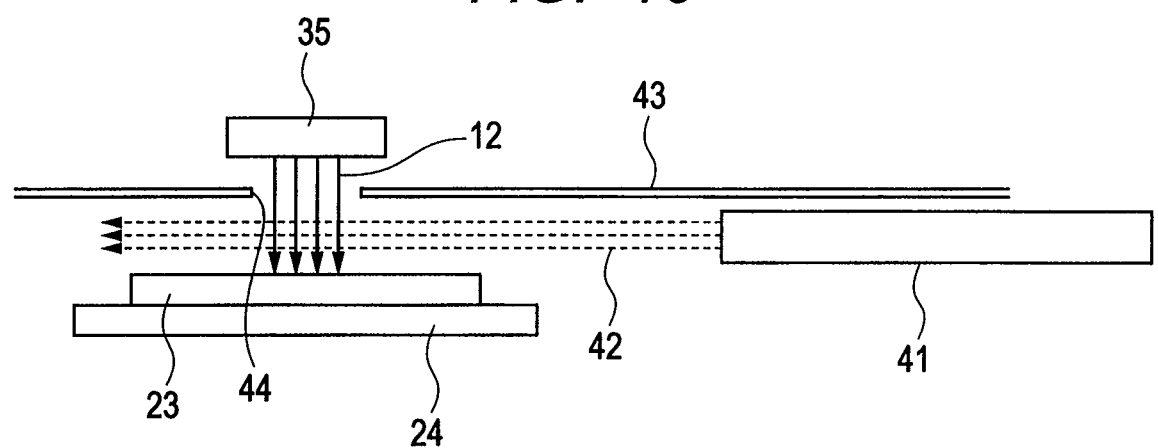
FIG. 10 is an enlarged view illustrating a partial region (i.e., a space for exposing an exposure-receiving object to EUV rays and the vicinity of the space) of the apparatus in FIG. 9.
Figure 11:
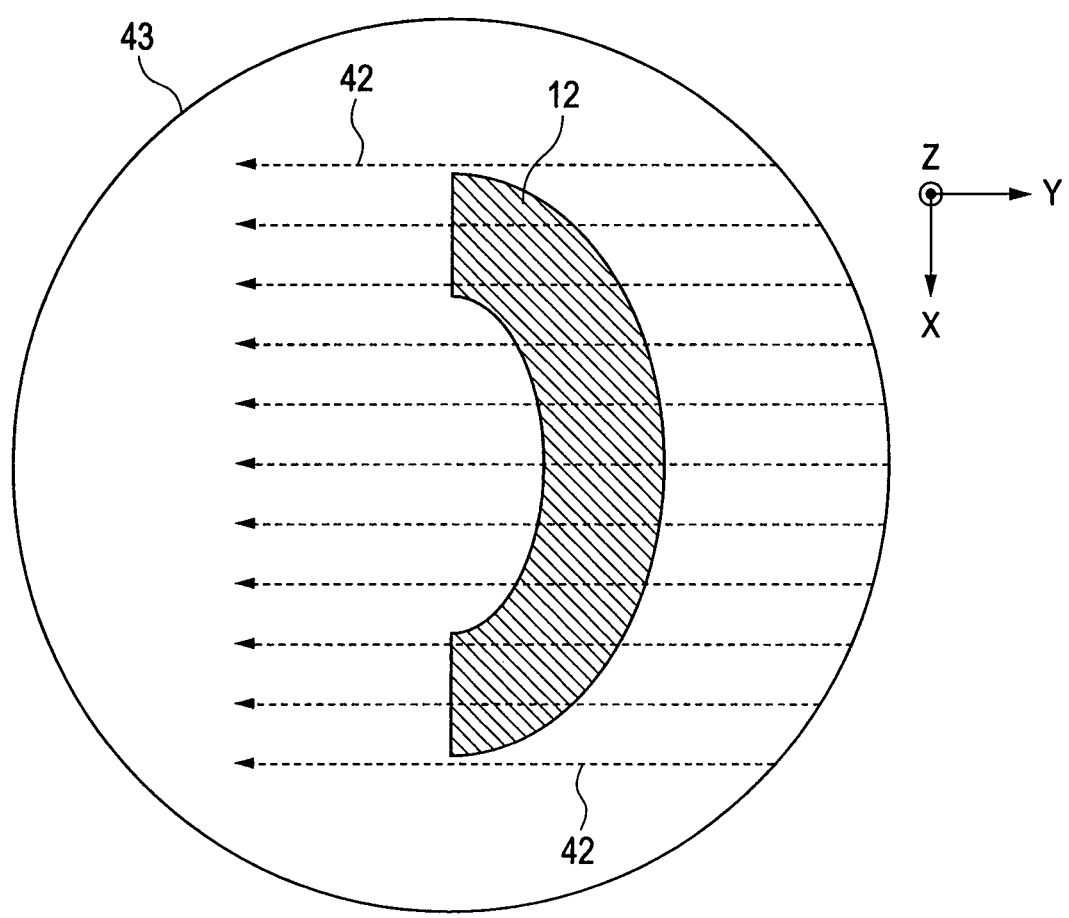
FIG. 11 is an enlarged plan view illustrating a partial region (i.e., the space for exposing the exposure-receiving object to the EUV rays) of the apparatus in FIG. 9.
Figure 12:
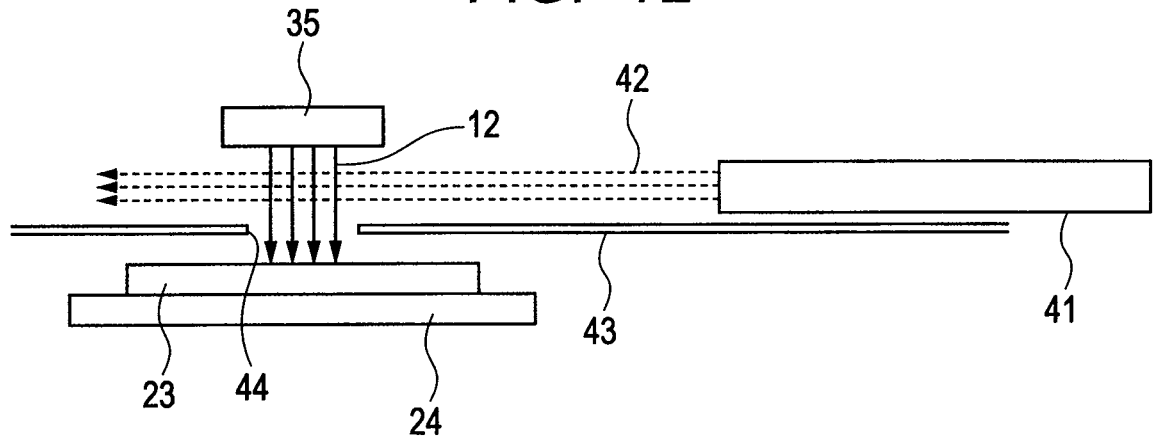
FIG. 12 is an enlarged view illustrating a different example of the EUV exposure apparatus that is the second embodiment of the invention.
Figure 13:
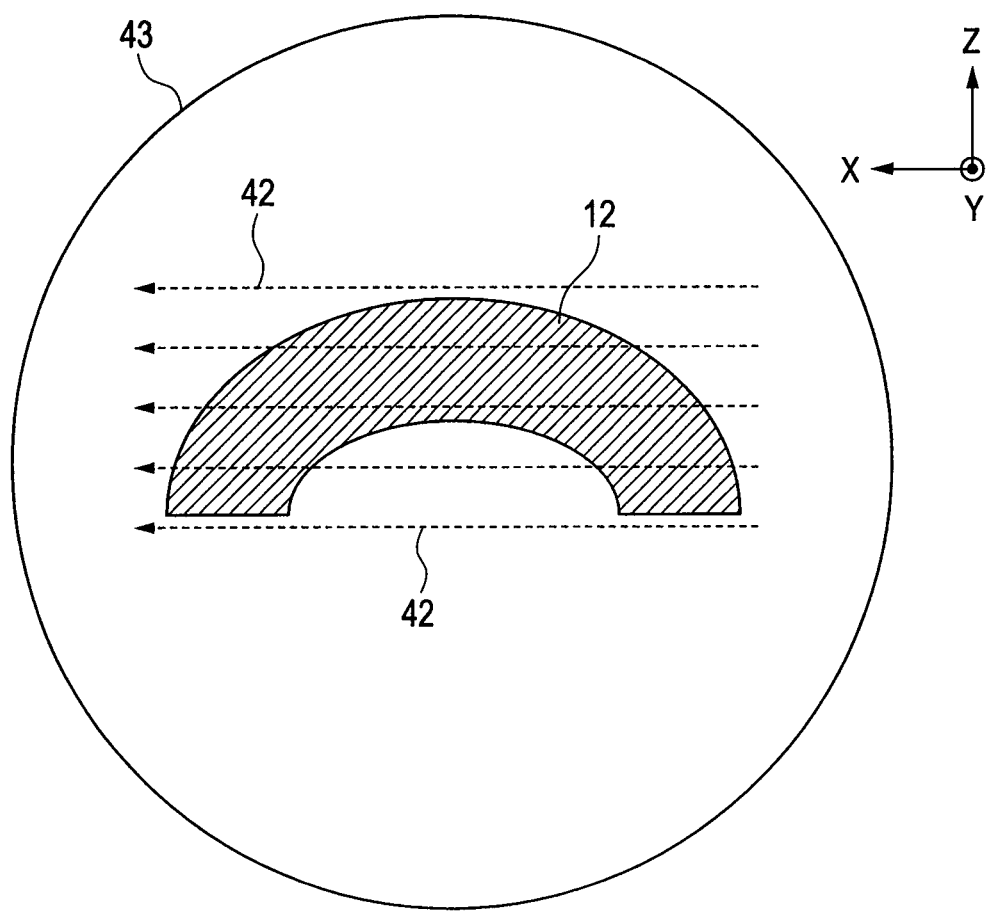
FIG. 13 is an enlarged view illustrating a further different example of the EUV exposure apparatus that is the second embodiment of the invention.

FIG. 9 is a schematic structural view illustrating a scanning EUV exposure apparatus 10B of a second embodiment of the invention. The EUV exposure apparatus 10B of the present embodiment is characterized by arranging, between a space for holding a projection optical system 37 and a wafer stage 24, an aperture having an opening 44 through which an EUV exposure light-bundle 12 is passed, and further setting up, between an EUV ray source 11 and an energy beam generating source 41, a system 45 for linking actions of the two with each other.

In an optical space between the EUV ray source 11 and a mask 21 may be arranged a shutter (not illustrated) the action of which is linked with the action of the energy beam generating source 41, thereby making control as to whether or not the EUV exposure light-bundle 12 is radiated onto the mask 12 by opening or closing this shutter. Any other structure of the EUV exposure apparatus 10B is equivalent to that of the EUV exposure apparatus 10A of the first embodiment.

When the system 45 is set up in the EUV exposure apparatus 10B, the timing of scanning exposures and that of the radiation of the energy beam 42 can be controlled with a high precision. When the aperture 43 is set up in the EUV exposure apparatus 10B, emission gases from the resist (concerned) do not easily diffuse to a lightening optical system 13, the projection optical system 37, the mask 21 nor the other members; therefore, the lightening optical system 13, the projection optical system 37, the mask 21 and the other member can be effectively restrained from being polluted by the emission gases.

As illustrated in FIGS. 10 to 13, the aperture 43 may be arranged above or below the energy beam generating source 41. The direction of the radiation of the energy beam 42 may be either along the Y axis direction or X axis direction.

Third Embodiment

Figure 14:
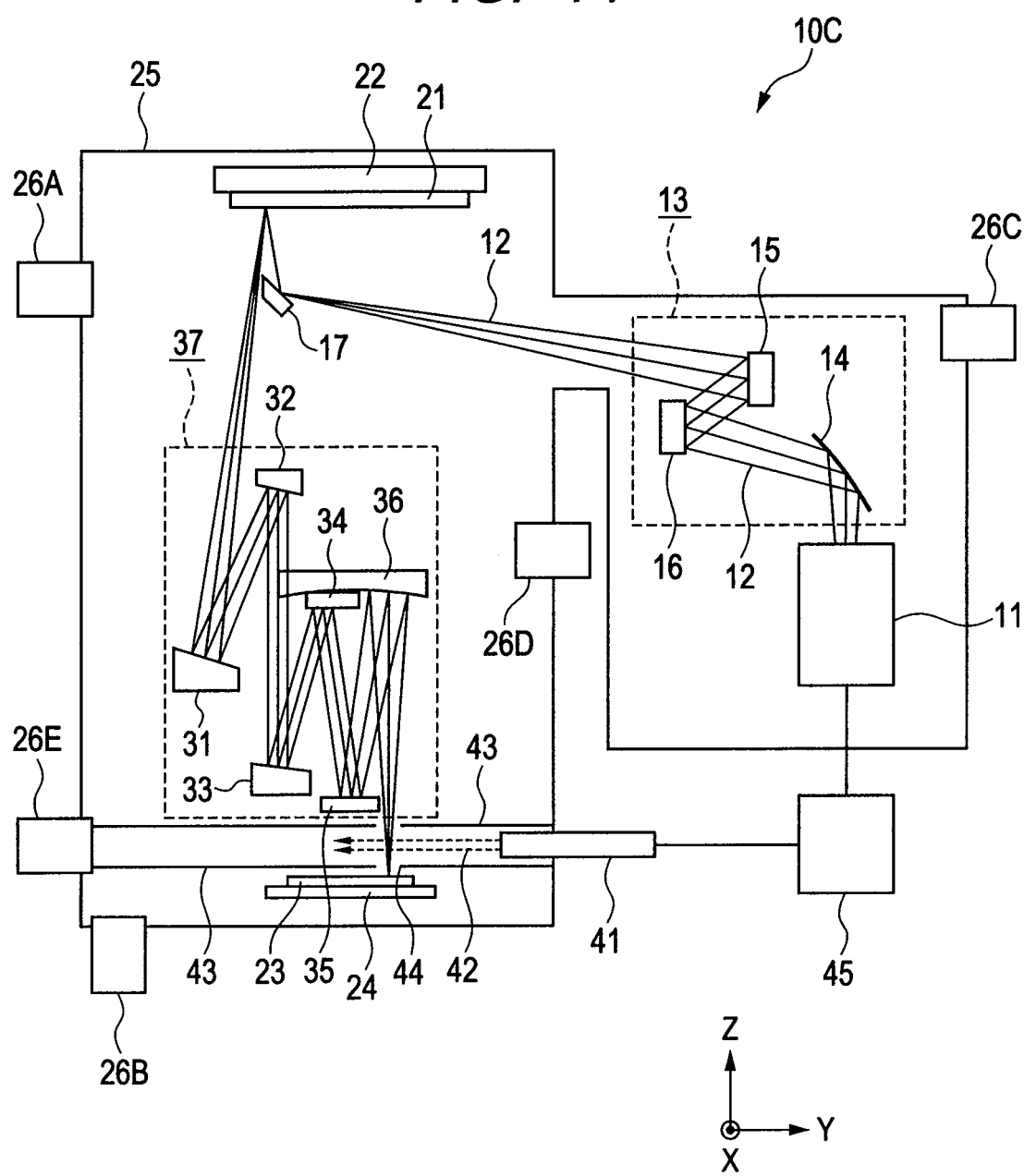
FIG. 14 is a schematic structural view of an EUV exposure apparatus that is a third embodiment of the invention.
Figure 15:
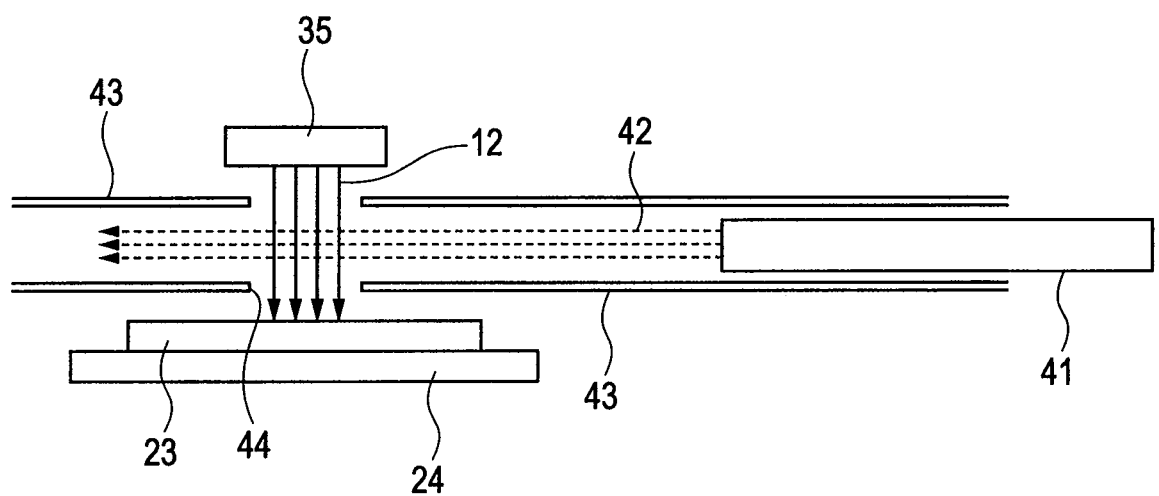
FIG. 15 is an enlarged view illustrating a partial region (i.e., a space for exposing an exposure-receiving object to EUV rays and the vicinity of the space) of the apparatus in FIG. 14.

FIG. 14 is a schematic structural view illustrating a scanning EUV exposure apparatus 10C of a third embodiment of the invention. FIG. 15 is an enlarged view illustrating a space for exposing an exposure-receiving object (wafer 23) to EUV rays inside the EUV exposure apparatus 10C, and a situation near the space.

The EUV exposure apparatus 10C of the embodiment is characterized in that the same aperture 43 as described in the second embodiment is arranged at a single site in each of spaces above and below an energy beam generating source 41, and further the apparatus 10C has a pump 26E for discharging any gas in the space surrounded by the paired apertures 43 and 43. Any other structure of the apparatus 10C is equivalent to that of the EUV exposure apparatus 10B of the second embodiment.

When the paired apertures 43 and 43 and the pump 26 are set up in the EUV exposure apparatus 10C, emission gases from the resist (concerned) and low-molecular-weight decomposed gases generated by irradiation with the energy beam 42 can be effectively discharged to the outside of the EUV exposure apparatus 10C. Accordingly, a lightening optical system 13, a projection optical system 37, a mask 21 and others can be effectively restrained from being polluted.

Fourth Embodiment

Figure 16:
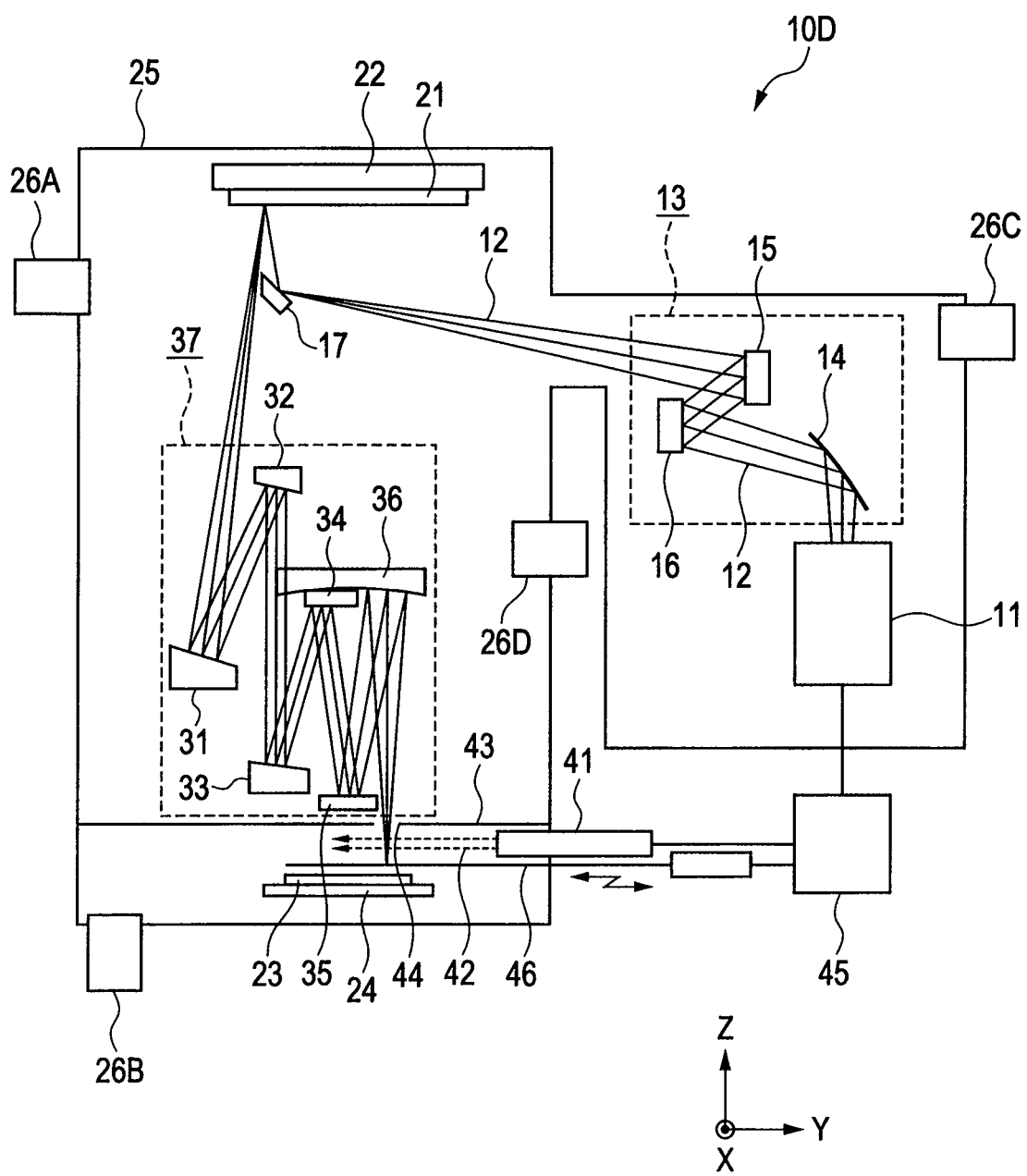
FIG. 16 is a schematic structural view of an EUV exposure apparatus that is a fourth embodiment of the invention.
Figure 17A:
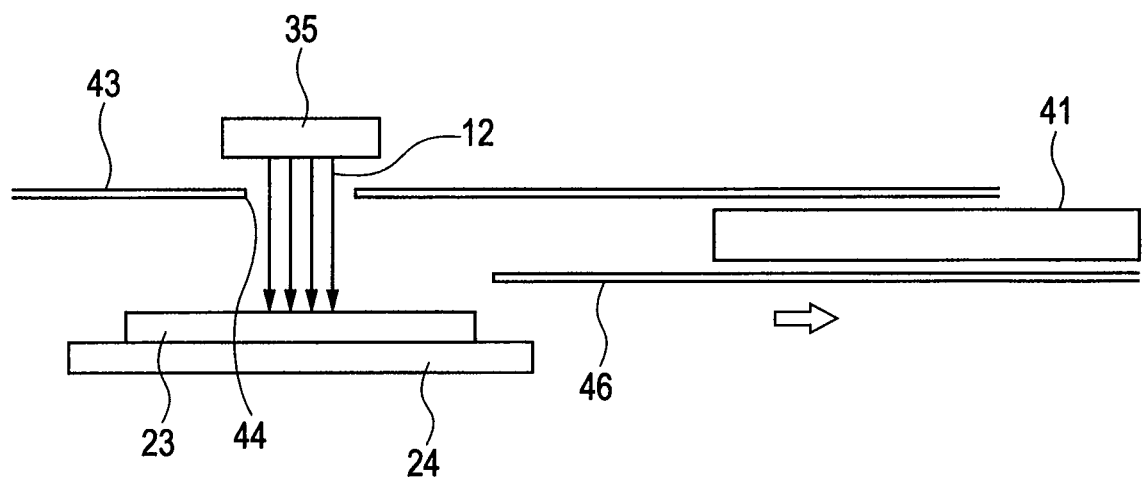
FIGS. 17A and 17B are each an enlarged view illustrating a partial region (i.e., a space for exposing an exposure-receiving object to EUV rays and the vicinity of the space) of the apparatus in FIG. 16.
Figure 17B:
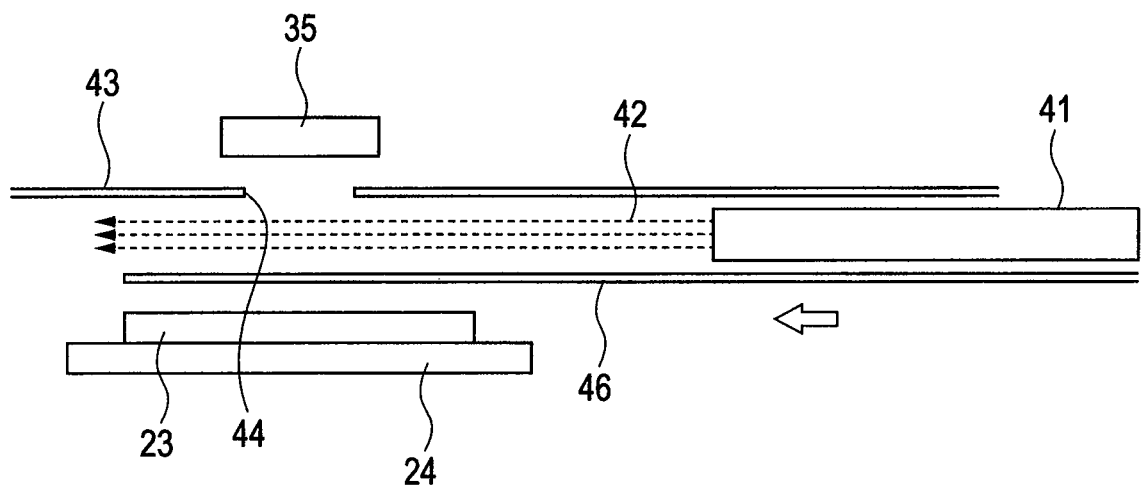

FIG. 16 is a schematic structural view illustrating a scanning EUV exposure apparatus 10D of a fourth embodiment of the invention, and FIGS. 17A and 17B are each an enlarged view illustrating a space for exposing an exposure-receiving object (wafer 23) to EUV rays inside the EUV exposure apparatus 10D, and a situation near the space.

The EUV exposure apparatus 10D of the embodiment is characterized by arranging a shutter 46 in an optical path space near a wafer stage 24, and further coupling this shutter 46 to a system 45 to link the respective actions of an EUV ray source 11, an energy beam generating source 41 and the shutter 46 with each other. Any other structure thereof is equivalent to that of the EUV exposure apparatus 10B of the second embodiment 2.

Figure 18:
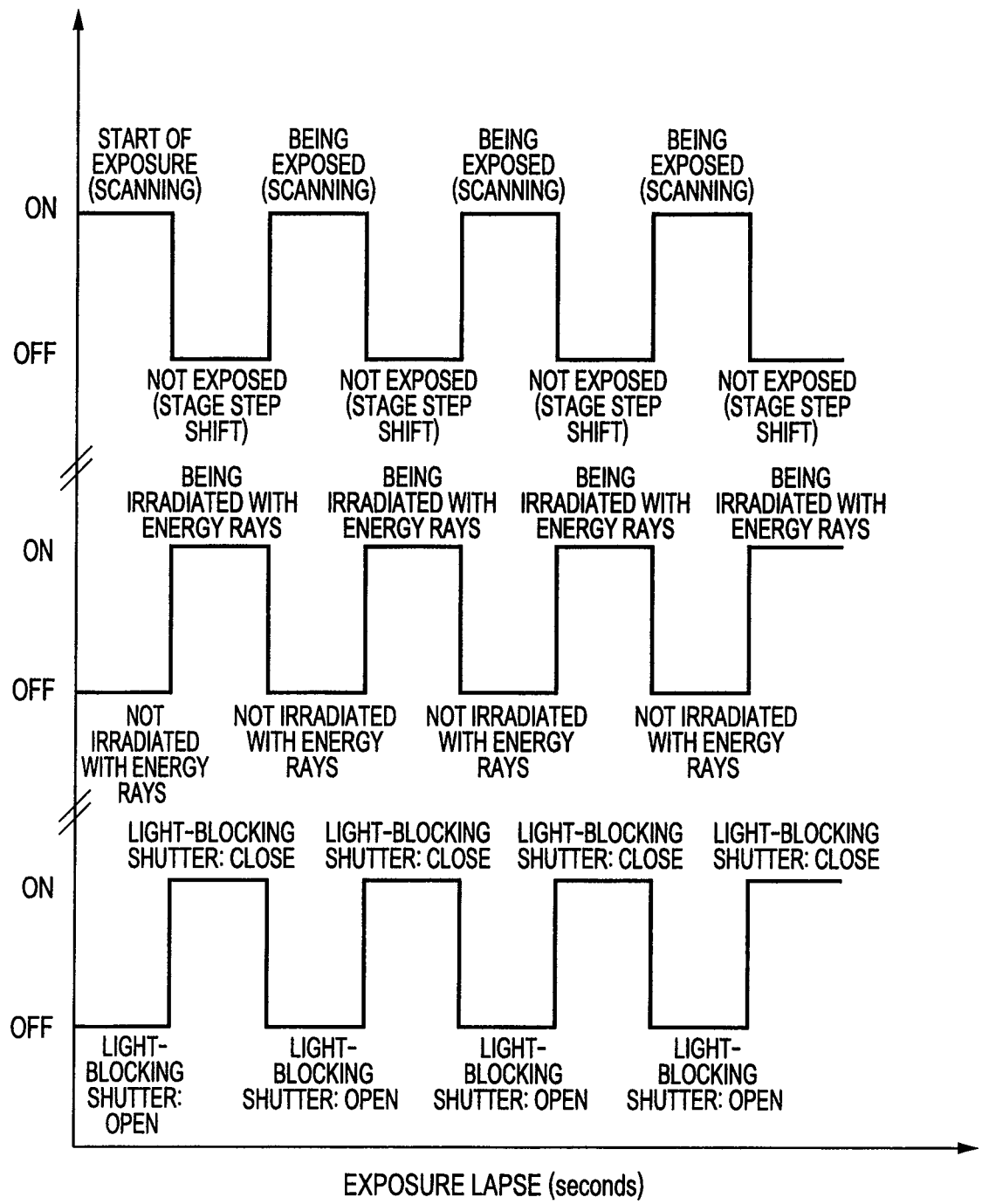
FIG. 18 is a timing chart showing an example of the timing at which an EUV exposure light-bundle emitted from an EUV ray source reaches to a wafer, the timing of radiating an energy beam, and the timing of opening or closing a shutter.

FIG. 18 is a timing chart showing an example of the timing at which an EUV exposure light-bundle 12 emitted from the EUV ray source 11 reaches to the wafer 23, the timing of radiating an energy beam 42, and the timing of opening or closing the shutter 46.

While any scanning exposure is performed, the shutter 46 is opened to be withdrawn from the vicinity of the space for exposing the wafer 23 to EUV rays, and further the radiation of the energy beam 42 is discontinued (see FIG. 17A). While the wafer stage 24 is shifted (stepped), the energy beam 42 is radiated in the state that the shutter 46 is closed (see FIG. 17B). According to this manner, the energy beam 42 does not reach to the front surface of the wafer 23; thus, when the energy beam 42 is, in particular, a beam including rays having short wavelengths, the resist (concerned) is prevented from being excessively exposed by the energy beam 42.

The above has described the invention made by the inventors by way of some embodiments. It is however needless to say that the invention is not limited to the embodiments, and may be variously modified or changed as far as the modifications or changes do not depart from the subject matter of the invention.

INDUSTRIAL APPLICABILITY

The invention is applicable to any exposure technique using an EUV ray as exposure light.

What is claimed is:

1. A light exposure method using an extreme ultraviolet (EUV) ray as exposure light to scan an exposure-receiving object in a scanning exposure manner, the method comprising:
   scanning the exposure-receiving object by the EUV ray, which is generated by a light source, in a cycle of scanning the exposure-receiving object having a surface on which a resist is painted and a mask in which a predetermined pattern is formed, the EUV ray is reflected by a plurality of mirrors;
   shifting or stepping the exposure-receiving object in a cycle of shifting or stepping the exposure-receiving object, thereby projecting the pattern formed in the mask to the exposure-receiving object; and radiating an energy beam, generated by an energy beam generator, to an optical path space thereby decomposing an emission gas from the resist, wherein the optical path space includes the exposure-receiving object, the mask, and an aperture having an opening through which the EUV ray passes, wherein the energy beam generator is disposed closer to the exposure-receiving object than the aperture, and the aperture is disposed closer to the exposure-receiving object than the plurality of mirrors, wherein during the cycle of scanning, the exposure-receiving object is scanned by the EUV ray, and during the cycle of shifting or stepping, the exposure-receiving object is not scanned by the EUV ray, wherein the energy beam generator generates the energy beam only during the cycle of shifting or stepping the exposure-receiving object, and wherein the cycle of shifting or stepping and the cycle of scanning alternate and repeat.

2. The light exposure method according to claim 1, wherein the energy beam comprises at least one of an infrared ray, a visible ray, an ultraviolet ray, a deep ultraviolet ray, an extreme ultraviolet ray, a vacuum ultraviolet ray, a soft X ray, a charged particle beam comprising electrons, a charged particle beam comprising ions, and a beam comprising neutral molecules.

3. The light exposure method according to claim 1, wherein the energy beam decomposes the emission gas that is a carbon compound having a molecular weight of 100 to 300.

4. The light exposure method according to claim 1, wherein the energy beam is radiated on the exposure-receiving object or a space near the object.

5. The light exposure method according to claim 1, wherein another aperture having another opening through which the EUV ray passes is disposed closer to the exposure-receiving object than the energy beam generator.

6. The light exposure method according to claim 5, wherein a pump for discharging any gas in a space surrounded by the aperture and the another aperture is disposed outside of the optical path space.

7. The light exposure method according to claim 1, further comprising:
a shutter disposed in the optical path space,
wherein the system controls the opening and closing of the shutter, and
wherein the system controls the shutter to open during the cycle of scanning and close during the cycle of shifting or stepping the exposure-receiving object.

8. A light exposure apparatus, comprising:
a chamber that holds:
an exposure light source that emits an EUV ray;
a mask stage on which a mask in which a predetermined pattern is formed is to be disposed;
an illuminating optical system that illuminates the mask with the EUV ray;
an exposure-receiving object stage on which an exposure-receiving object having a surface on which a resist is painted is to be disposed;
a projection optical system, including a plurality of mirrors, that projects the pattern formed in the mask to the exposure-receiving object;
an energy beam generating source that generates an energy beam for decomposing an emission gas from the resist;
a system controlling the light source generating the EUV ray and the energy beam generator generating the energy beam;

a gas discharging system that discharges any gas inside the chamber; and
an aperture having an opening through which the EUV ray passes, wherein, the energy beam generating source is disposed closer to the exposure-receiving object than the aperture, and the aperture is disposed closer to the exposure-receiving object than the plurality of mirrors, and wherein the system controls the exposure light source to scan the exposure-receiving object by the EUV ray in a cycle of scanning the exposure-receiving object, and in a cycle of shifting or stepping the exposure-receiving object, in which the exposure-receiving object is shifted or stepped, the system controls the exposure light source to not scan the exposure-receiving object, wherein the system controls the energy beam generator to generate the energy beam only during the cycle of shifting or stepping the exposure-receiving object, and wherein the cycle of shifting or stepping and the cycle of scanning alternate and repeat.

9. The light exposure apparatus according to claim 8, wherein the energy beam comprises at least one of an infrared ray, a visible ray, an ultraviolet ray, a deep ultraviolet ray, an extreme ultraviolet ray, a vacuum ultraviolet ray, a soft X ray, a charged particle beam comprising electrons, a charged particle beam comprising ions, and a beam comprising neutral molecules.

10. The light exposure apparatus according to claim 8, wherein
the energy beam decomposes the emission gas that is a carbon compound having a molecular weight of 100 to 300.

11. The light exposure apparatus according to claim 8, wherein
the energy beam generating source comprises at least one of a mercury lamp, a xenon lamp, an excimer lamp, an excimer laser source, a semiconductor laser source, a laser-excited plasma light source, a discharge-excited plasma light source, an electron beam source, an ion beam source, and a proton beam source.

12. The light exposure apparatus according to claim 8, wherein the energy beam generating source is arranged near the exposure-receiving object stage.

13. The light exposure apparatus according to claim 8, further comprising:
another aperture having another opening through which the EUV ray passes, which is disposed closer to the exposure-receiving object than the energy beam generator.

14. The light exposure apparatus according to claim 13, further comprising:
a pump for discharging any gas in a space surrounded by the aperture and the another aperture, which is disposed outside the chamber.

15. A light exposure apparatus comprising:
a chamber that holds:
an exposure light source that emits an EUV ray;
a mask stage on which a mask in which a predetermined pattern is formed is to be disposed;
an illuminating optical system that illuminates the mask with the EUV ray;
an exposure-receiving object stage on which an exposure-receiving object having a surface on which a resist is painted is to be disposed;
a projection optical system, including a plurality of mirrors, that projects the pattern formed in the mask to the exposure-receiving object;

an energy beam generating source that generates an energy beam for decomposing an emission gas from the resist;

a system controlling the light source generating the EUV ray and the energy beam generator generating the energy beam;

a gas discharging system that discharges any gas inside the chamber;

an aperture having an opening through which the EUV ray passes; and a shutter disposed in an optical path space between the aperture and the exposure-receiving object, wherein the energy beam generating source is disposed closer to the exposure-receiving object than the aperture, and the aperture is disposed closer to the exposure-receiving object than the plurality of mirrors, wherein the system controls the exposure light source to scan the exposure-receiving object by the EUV ray in a cycle of scanning the exposure-receiving object, and in a cycle of shifting or stepping the exposure-receiving object, in which the exposure-receiving object is shifted or stepped, the system controls the exposure light source to not scan the exposure-receiving object, wherein the system controls the opening and closing of the shutter, wherein the system controls the shutter to open during the cycle of scanning and close during the cycle of shifting or stepping the exposure-receiving object, wherein the system controls the energy beam generator to generate the energy beam only during the cycle of shifting or stepping the exposure-receiving object, and wherein the cycle of shifting or stepping and the cycle of scanning alternate and repeat.

* * * * *